US008488307B2

(12) United States Patent
Cheng et al.

(10) Patent No.: US 8,488,307 B2
(45) Date of Patent: Jul. 16, 2013

(54) POINT-OF-SALE SYSTEM BRACKET AND A POINT-OF-SALE SYSTEM

(75) Inventors: Sheng-Hsiung Cheng, New Taipei (TW); Yao-Wen Hsu, New Taipei (TW); Yen-Chun Chou, New Taipei (TW)

(73) Assignee: Aopen Inc., New Taipei (TW)

( * ) Notice: Subject to any disclaimer, the term of this patent is extended or adjusted under 35 U.S.C. 154(b) by 70 days.

(21) Appl. No.: 13/333,510

(22) Filed: Dec. 21, 2011

(65) Prior Publication Data

US 2012/0224317 A1 Sep. 6, 2012

(30) Foreign Application Priority Data

Mar. 3, 2011 (TW) ............................ 100107121 A

(51) Int. Cl.
*G06F 1/16* (2006.01)
*H05K 7/00* (2006.01)

(52) U.S. Cl.
USPC .................. 361/679.04; 361/679.21; 361/825

(58) Field of Classification Search
USPC .................. 361/679.02, 679.04, 679.21, 825; 248/917–924; 211/26
See application file for complete search history.

(56) References Cited

U.S. PATENT DOCUMENTS 6,554,238 B1 * 4/2003 Hibberd ..................... 248/278.1
8,066,241 B2 * 11/2011 Yu et al. ..................... 248/286.1
2007/0170336 A1 * 7/2007 Li ................................ 248/324

* cited by examiner

*Primary Examiner* — Ramon Barrera
(74) *Attorney, Agent, or Firm* — Merchant & Gould P.C.

(57) ABSTRACT

A Point-Of-Sale (POS) system bracket includes a bracket housing and two mounts. The bracket housing includes two opposite sidewalls having inner surfaces, outer surfaces each having a substantially convex shape, and a plurality of positioning holes formed at different heights in the sidewalls. The mounts have outer sides for fixing respectively of two displays, and inner sides to be attached to the outer surfaces of the respective sidewalls. A plurality of locking elements extend respectively through a selected group of the positioning holes from the inner surfaces of the sidewalls to fasten the mounts to the respective sidewalls. The locking elements can be changed in position from one group to the other group of the positioning holes, so that the mounts can be positioned at different heights on the respective sidewalls, and the displays can be disposed at different inclination angles.

30 Claims, 6 Drawing Sheets

POINT-OF-SALE SYSTEM BRACKET AND A POINT-OF-SALE SYSTEM

CROSS REFERENCE TO RELATED APPLICATION

This application claims priority of Taiwanese Patent Application No. 100107121, filed on Mar. 3, 2011, the disclosure of which is incorporated herein by reference.

BACKGROUND OF THE INVENTION

1. Field of the Invention

The invention relates to a Point-Of-Sale (POS) system, more particularly to a POS system bracket.

2. Description of the Related Art

A conventional Point-Of-Sale (POS) system, as disclosed in Taiwanese Patent No. M276273, has a computer main module that includes a computer housing, and a plurality of electronic components disposed in the computer housing, and a display connected pivotally to the computer housing.

However, because the overall structure of the POS system is bulky, it is difficult to transport the POS system. Further, the possibility of expanding either the computer main module or the display is difficult. Moreover, the display is usually connected pivotally to the computer housing a complicated hinge structure, so that the cost incurred is high.

SUMMARY OF THE INVENTION

Therefore, an object of the present invention is to provide a Point-Of-Sale (POS) system bracket that can be easily disassembled to facilitate transport thereof, that can permit expansion of the POS system, and that uses a low cost structure to achieve adjustment of a display to different inclination angles.

A Point-Of-Sale (POS) system bracket for installation of a computer main module and two displays according to one aspect of this invention comprises a bracket housing, two mounts, and a plurality of locking elements. The bracket housing includes a bracket body and a bottom support. The bracket body is formed with an accommodation space for receiving the computer main module, and includes two opposite sidewalls having inner surfaces facing the accommodation space, outer surfaces each having a substantially convex shape, and a plurality of positioning holes formed at different heights in the sidewalls. The bottom support is connected to the bracket body to support the bracket body on a surface. The mounts are provided for respectively mounting the displays on the sidewalls. Each mount has an outer side adapted to be fixed to one of the displays, and an inner side to be attached to the outer surface of one of the sidewalls. The locking elements extend respectively through a selected group of the positioning holes from the inner surfaces of the sidewalls to fasten the mounts to the respective sidewalls. The locking elements can be changed in position from one group of the positioning holes to the other group of the positioning holes, so that the mounts can be positioned at different heights on the respective sidewalls, and the displays can be disposed at different inclination angles.

Through the structural design of the two sidewalls of the bracket body, and in cooperation with the mounts and the locking elements, as compared to the conventional POS system, the present invention has a simple structure to achieve adjustment of the inclination angles of the displays. Further, because disassembly is easy, transport of the POS system is convenient.

Preferably, the bracket housing further includes a transformer-receiving portion disposed below the bracket body, and a transformer received in the transformer-receiving portion.

Preferably, the bracket housing further includes a wire-handling structure disposed below the bracket body for winding of a wire.

Preferably, the wire-handling structure includes a plurality of wire-handling plates. Each wire-handling plate has a first side plate connected to and extending downward from the bracket body, and a second side plate connected to and extending transversely of the first side plate. The first side plates of the wire-handling plates are spaced apart from each other. The second side plates of the wire-handling plates extend in directions away from each other. The first side plates are adapted to be wound by the wire. The second side plates are adapted to be disposed below the wound wire.

Preferably, the bracket housing further includes two lug plates extending respectively and transversely from the first side plates toward each other and opposite to the second side plates. The first side plates and the lug plates cooperatively define the transformer-receiving portion. The transformer is supported by the lug plates.

Preferably, the bottom support includes two spaced-apart support plates connected to and extending downward from the bracket body. The wire-handling structure and the transformer-receiving portion are disposed between the support plates.

Preferably, the bracket housing further includes a flat holding plate connected to the first side plates and disposed in the accommodation space. The flat holding plate is adapted to hold and support the computer main module.

Preferably, the inner side of each mount has a concave shape that complements the outer surface of the respective sidewall.

Preferably, each mount is hollow, and includes an outer wall, two opposite first lateral walls and two opposite second lateral walls connected to the outer wall, and two spaced-apart inner walls extending respectively from the second lateral walls toward each other. The outer wall defines the outer side of a respective mount. Each first lateral wall has a concave bottom edge complementing the outer surface of the corresponding sidewall. The inner walls are substantially flush with the bottom edges of the first lateral walls, and define the inner side of the corresponding mount.

Preferably, the bracket body has a tubular wall that extends around a horizontal axis, and the sidewalls are two portions of the tubular wall on two opposite sides of the horizontal axis.

Preferably, the bracket body further includes a top wall connected to the sidewalls. The top wall is provided with a slot for extension of a wire therethrough.

Preferably, the bracket body has two axially opposite open ends communicating with the accommodation space. The POS system bracket further comprises two end caps connected removably to and covering the open ends of the bracket body, respectively.

Preferably, each end cap is formed with a plurality of heat-dissipating holes.

Preferably, the positioning holes in each sidewall are configured as spaced-apart through holes that are aligned along a direction from a high level to a low level.

Preferably, the positioning holes are configured as elongate holes that are elongated along a direction from a high level to a low level.

Another object of the present invention is to provide a Point-Of-Sale (POS) system that comprises the aforesaid POS system bracket, a computer main module, and a display.

According to another aspect of this invention, a Point-Of-Sale (POS) system comprises a computer main module, two displays, and a POS system bracket. The POS system bracket has a bracket housing, two mounts, and a plurality of locking elements. The bracket housing includes a bracket body and a bottom support. The bracket body is formed with an accommodation space to receive the computer main module, and includes two opposite sidewalls having inner surfaces facing the accommodation space, outer surfaces each having a substantially convex shape, and a plurality of positioning holes formed at different heights in the sidewalls. The bottom support is connected to the bracket body to support the bracket body on a surface. The mounts are provided to respectively mount the displays on the sidewalls. Each mount has an outer side to be fixed to one of the displays, and an inner side to be attached to the outer surface of one of the sidewalls. The locking elements extend respectively through a selected group of the positioning holes from the inner surfaces of the sidewalls to fasten the mounts to the respective sidewalls. The locking elements can be changed in position from one group of the positioning holes to the other group of the positioning holes, so that the mounts can be positioned at different heights on the respective sidewalls, and the displays can be disposed at different inclination angles.

BRIEF DESCRIPTION OF THE DRAWINGS

Other features and advantages of the present invention will become apparent in the following detailed description of the embodiment with reference to the accompanying drawings, of which.

DETAILED DESCRIPTION OF THE PREFERRED EMBODIMENT

Figure 1:
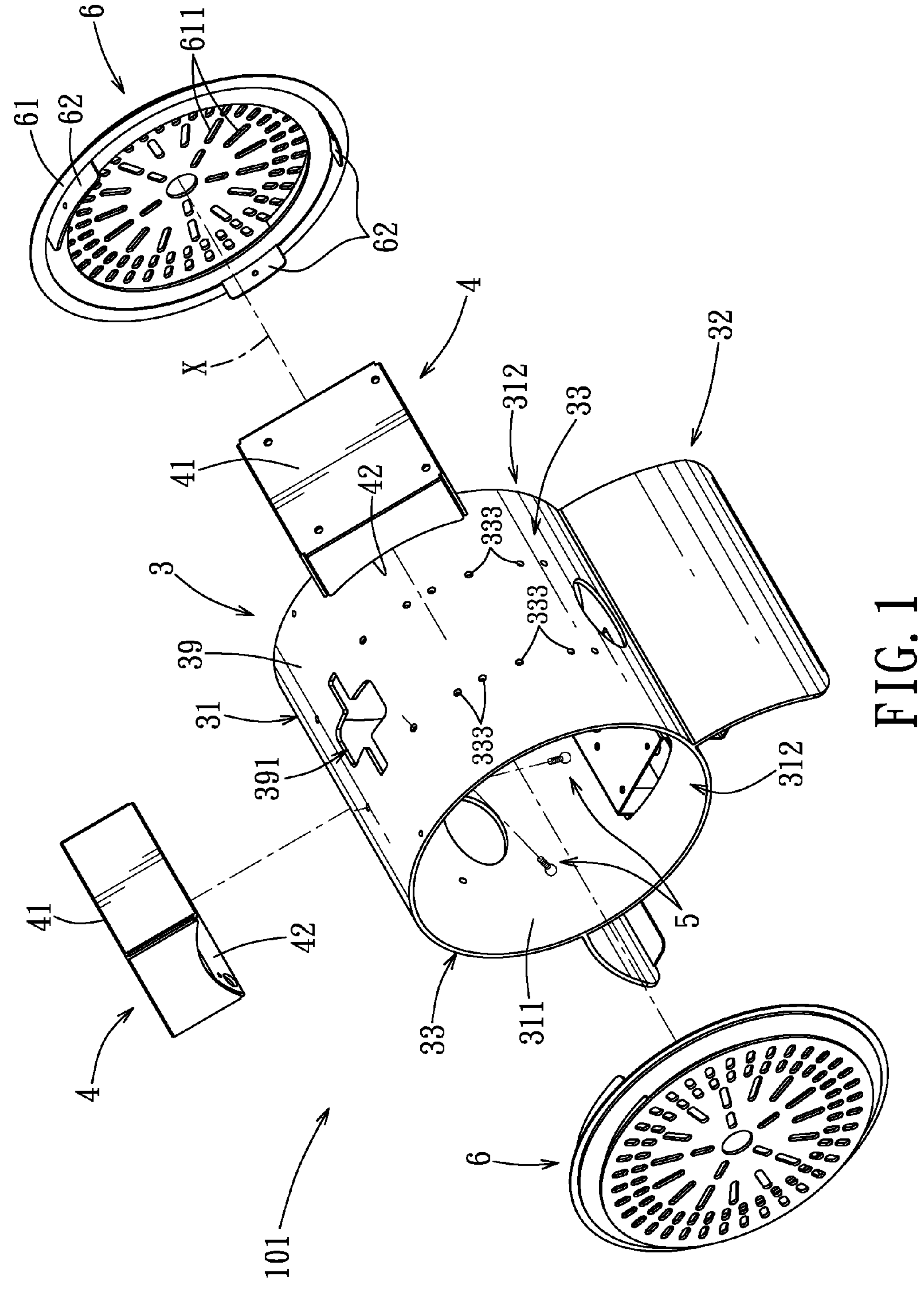
FIG. 1 is an exploded perspective view of a Point-Of-Sale (POS) system bracket of a Point-Of-Sale (POS) system according to the embodiment of this invention.

The above-mentioned and other technical contents, features, and effects of this invention will be clearly presented from the following detailed description of one embodiment in coordination with the reference drawings.

Referring to FIGS. 1 to 6, a Point-Of-Sale (POS) system 100 according to the embodiment of the present invention comprises a Point-Of-Sale (POS) system bracket 101, and a computer main module 11 and two displays 12 installed on the POS system bracket 101. In this embodiment, the computer main module 11 is a barebone.

The POS system bracket 101 includes a bracket housing 3, two mounts 4, and a plurality of locking elements 5. Each of the bracket housing 3 and the mounts 4 can be formed from a metal plate. The bracket housing 3 includes a bracket body 31, and a bottom support 32 connected to the bracket body 31 to support the same on a surface 102, such as a desktop. The bracket body 31 is formed with an accommodation space 311 to receive the computer main module 11, and includes two opposite sidewalls 33 having inner surfaces 331 facing the accommodation space 311, outer surfaces 332 each having a substantially convex shape, and a plurality of positioning holes 333 extending respectively through the inner and outer surfaces 331, 332 and formed at different heights in the sidewalls 33.

The mounts 4 are provided to respectively mount the displays 12 on the sidewalls 33, respectively. Each of the mounts 4 has an outer side 41 to be fixed to one of the displays 12, and an inner side 42 to be attached to the outer surface 332 of the respective sidewall 33.

The locking elements 5 extend respectively through a selected group of the positioning holes 333 from the inner surfaces 331 of the sidewalls 33 so as to fasten the mounts 4 to the respective sidewalls 33. That is, the locking elements 5 extend from an inner side to an outer side of the accommodation space 311 through the corresponding sidewalls 33 to engage the corresponding mounts 4. The locking elements 5 can be changed in position from one group of the positioning holes 333 to the other group of the positioning holes 333, so that the mounts 4 can be positioned at different heights on the respective sidewalls. As a result, the displays 12 can be disposed at different inclination angles. In this embodiment, each locking element 5 is configured as a thumb screw, which is easy for a user to extend his/her hand into the accommodation space 311 for manual operation. Alternatively, each locking element 5 may be configured as an ordinary screw, a hexagon socket head cap screw, a countersunk head screw, etc.

From the aforesaid description, through cooperation of the mounts 4, the positioning holes 333, and the locking elements 5, the displays 12 can be mounted fixedly to the bracket body 31 at different inclination angles. Compared with the conventional hinge structure connecting method, the present invention has a simple connecting structure, and thus has a low cost. Further, the bracket body 31 that accommodates the computer main module 11 and the mounts 4 that respectively accommodate the displays 12 are easily assembled or disassembled through the locking elements 5. Hence, during transport, the system 100 can be disassembled to a minimum volume. Further, because the computer main module 11 and the displays 12 can be removed easily, the expandability of the system 100 is high.

Figure 2:
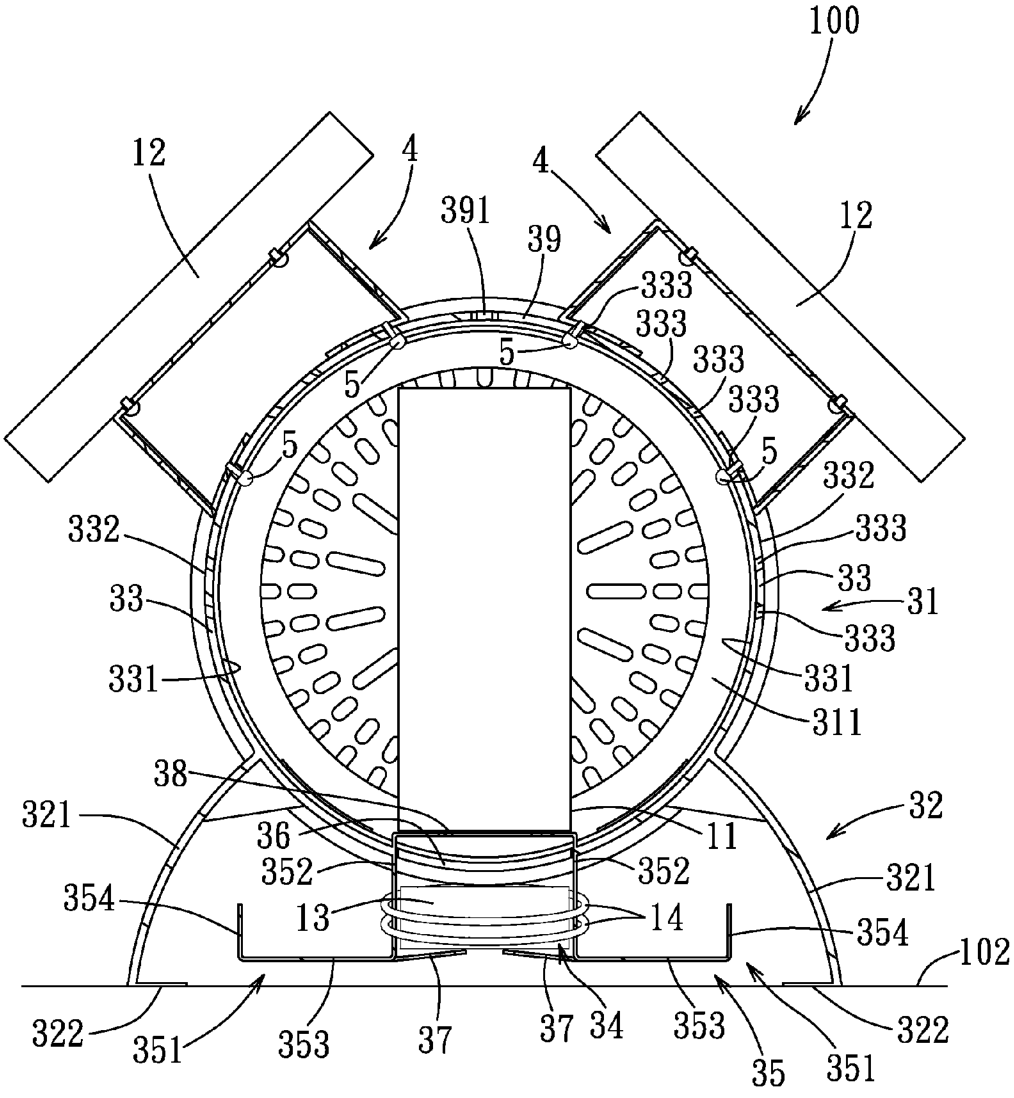
FIG. 2 is a partly sectional side view of the POS system of the embodiment, with one end cap removed for clarity's sake.
Figure 4:
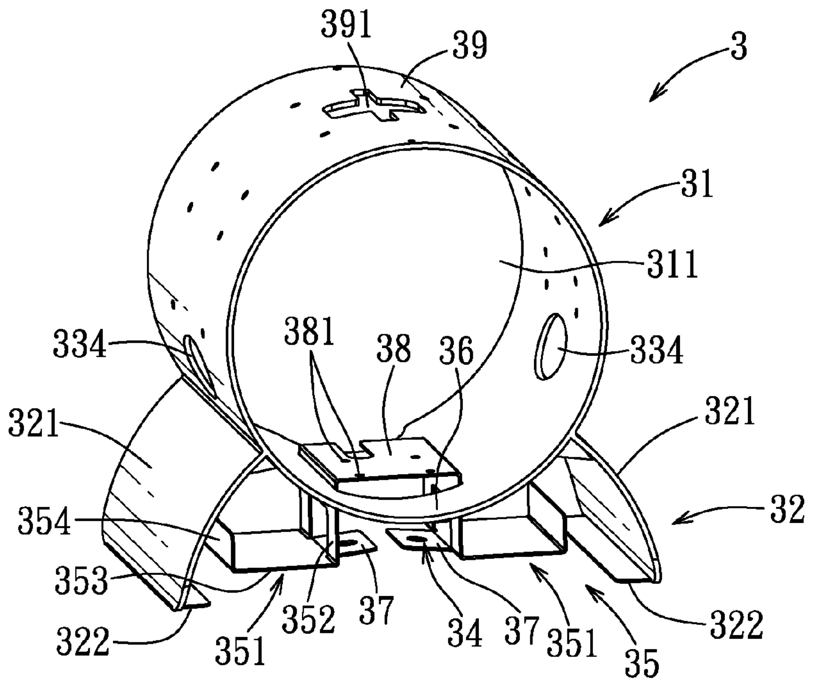
FIG. 4 is a perspective view of a bracket body of the POS system bracket of the embodiment.

With reference to FIGS. 2 and 4, preferably, the bracket housing 3 further includes a transformer-receiving portion 34 disposed below the bracket body 31, and a transformer 13 received in the transformer-receiving portion 34 and connected electrically to the computer main module 11. Because the computer main module 11 is a barebone, it can provide good allocations for components.

Preferably, the bracket housing 3 further includes a wire-handling structure 35 disposed below the bracket body 31 for winding of a wire 14 which is connected electrically to the computer main module 11. The wire-handling structure 35 provides a good wire-handling mechanism.

More concretely, the bracket body 31 further includes a bottom wall 36 interconnecting bottom ends of the sidewalls 33, and the wire-handling structure 35 includes two wire-handling plates 351 each having a substantially L-shaped configuration. Each of the wire-handling plates 351 has a first side plate 352 connected to and extending downward from the bottom wall 36, and a second side plate 353 connected to a bottom end of the first side plate 352 and extending transversely of the first sideplate 352. The first side plates 352 of the wire-handling plates 35 are spaced apart from each other. The second side plates 353 of the wire-handling plates 35 extend in directions away from each other. The first side plates 352 are adapted to be wound by the wire 14. The second side plates 353 are adapted to be disposed below the wound wire 14. Each wire-handling plate 351 may further include a third side plate 354 extending upward from an outer end of the respective second side plate 353 and spaced apart from the respective first side plate 352.

The bracket housing 3 further includes two lug plates 37 extending respectively and transversely from the bottom ends of the first side plates 352 toward each other and opposite to the second side plates 353. The lug plates 37 are spaced apart from and are disposed below the bottom wall 36. The lug plates 37, the first side plates 352, and the bottom wall 36 cooperatively define the transformer-receiving portion 34. When the transformer 14 is disposed in the transformer-receiving portion 34, the transformer 14 is supported by the lug plates 37.

It is worth mentioning that, in this embodiment, the transformer-receiving portion 34 is defined by a portion (i.e., the first side plates 352) of the wire-handling structure 35. Alternatively, the transformer-receiving portion 34 may be an independently formed structure.

In this embodiment, the bottom support 32 includes two spaced-apart support plates 321 connected to and extending downward from the bottom wall 36, and two extension bottom plates 322 extending horizontally from bottom ends of the respective support plates 321 toward each other. Preferably, the support plates 321 gradually extend downwardly and curvedly from the bottom wall 36. The wire-handling structure 35 and the transformer-receiving portion 34 are disposed between the support plates 321. Through the provision of the extension bottom plates 322, the bracket body 31 can be supported more stably on the surface 102.

Preferably, the bracket housing 3 further includes a flat holding plate 38 connected to top ends of the first side plates 352 and disposed in the accommodation space 311 above the bottom wall 36 to hold and support the computer main module 11. The flat holding plate 38 is formed with a plurality of lock holes 381 for extension of screws in a bottom-to-top direction so as to secure the computer main module 11 on the flat holding plate 38.

Figure 3:
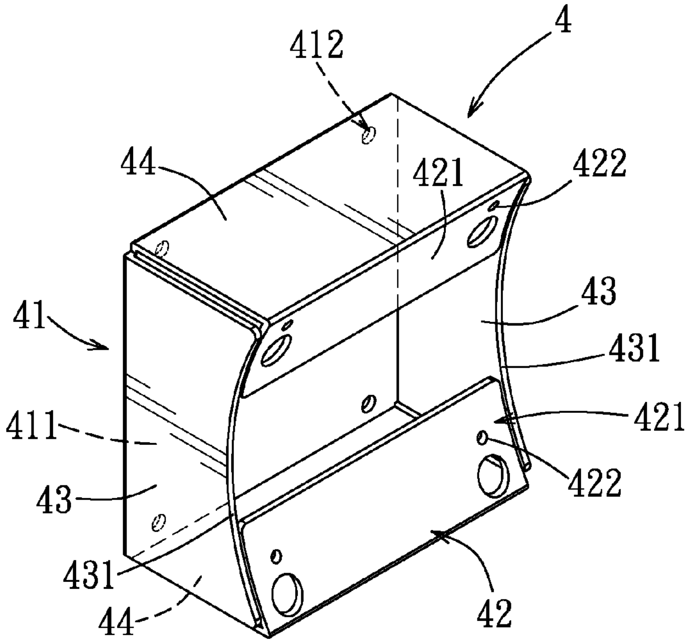
FIG. 3 is a perspective view of a mount of the embodiment.

With reference to FIGS. 2 and 3, in this embodiment, the outer surface 332 of each sidewall 33 has a substantially convex shape, and the inner side 42 of each mount 4 has a concave shape that complements the outer surface 332 of the respective sidewall 33. As such, the inner side 42 of each mount 4 can abut against the outer surface 332 of the respective sidewall 33.

In this embodiment, each mount 4 is made by stamping and bending a metal plate to form a hollow casing that includes an outer wall 411, two opposite first lateral walls 43 and two opposite second lateral walls 44 connected respectively to four ends of the outer wall 411, and two spaced-apart inner walls 421 extending respectively from bottom ends of the second lateral walls 44 toward each other. The outer wall 411 is formed with a plurality of lock holes 412 conforming to the VESA (Video Electronics Standard Association) specification. The outer wall 411 and the lock holes 412 cooperatively define an outer side 41 of the respective mount 4. Each first lateral wall 43 has a concave bottom edge 431 complementing the outer surface 332 of the respective sidewall 33. The inner walls 421 are substantially flush with the concave bottom edges 431 of the first lateral walls 43. The inner walls 421 are provided with a plurality of lock holes 422 for aligning engagement with the corresponding positioning holes 333. The inner walls 421 and the lock holes 422 cooperatively define the inner side 42 of the corresponding mount 4.

Figure 5:
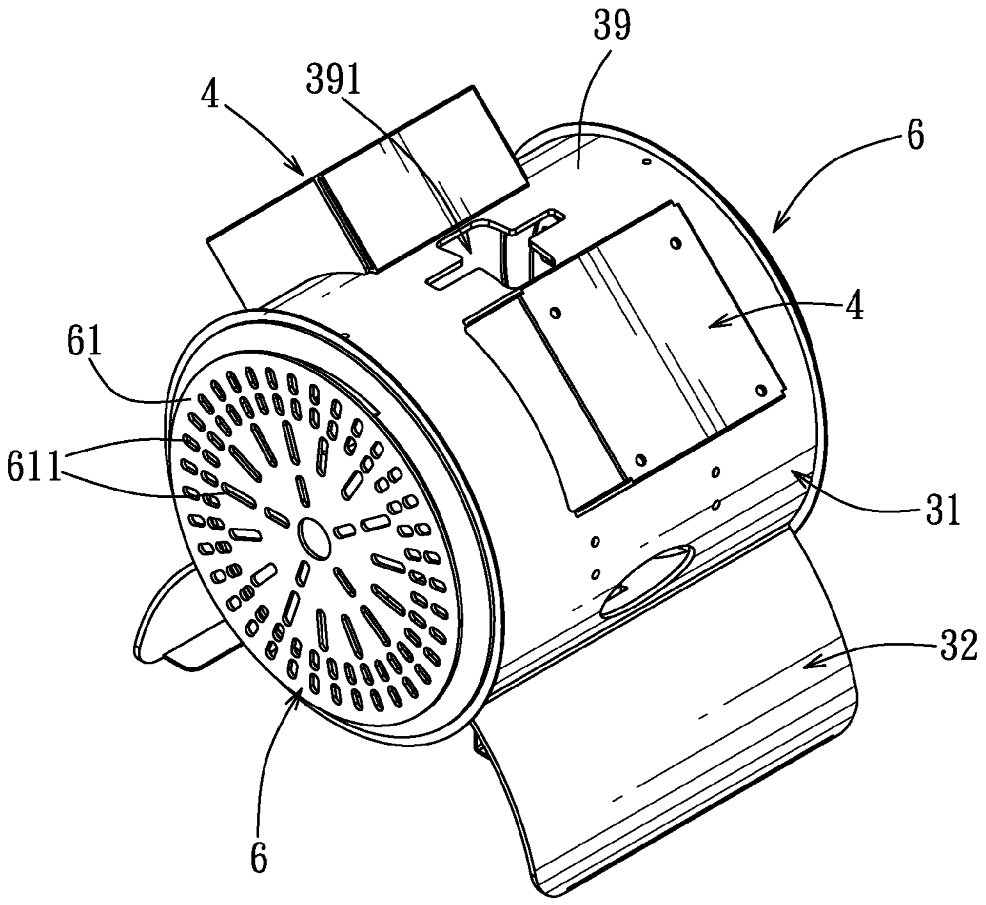
FIG. 5 is a perspective view of the POS system bracket of the embodiment in an assembled state.

With reference to FIGS. 1, 4 and 5, preferably, the bracket body 31 further includes a top wall 39 interconnecting top ends of the sidewalls 33. The top wall 39 is formed with a slot 391 for extension of the wire 14 (see FIG. 2) therethrough and for facilitating wire handling between the computer main module 11 and the displays 12. The slot 391 has a cross shape for easy positioning of the wire 14. Alternatively, the slot 391 may have a rectangular shape, a circular shape, or other geometric shapes. Further, each sidewall 33 may be provided with an aperture 334 at an appropriate position for extension of the wire of the respective display 12 into the accommodation space 311.

In this embodiment, as shown in FIG. 1, the bracket body 31 has a tubular wall extending around a horizontal axis (X) and defining the accommodation space 311, and the sidewalls 33 are two portions of the tubular wall on two opposite sides of the horizontal axis (X). Further, the bracket body 31 has two axially opposite open ends 312 communicating with the accommodation space 311. Preferably, the POS system bracket 101 further includes two end caps 6 connected removably to and covering the open ends 312 of the bracket body 31, respectively, so that the computer main module 11 can be hidden inside the accommodation space 311, and the appearance of the POS system bracket 101 can be maintained. Moreover, each of the end caps 6 includes an end cap plate 61 formed with a plurality of heat-dissipating holes 611, and a plurality of angularly spaced-apart locking plates 62 extending axially and inwardly from the end cap plate 61. When the end caps 6 are connected to the open ends 312 of the bracket body 31, the locking plates 62 extend fittingly into the bracket body 31 and fix thereto.

Figure 6:
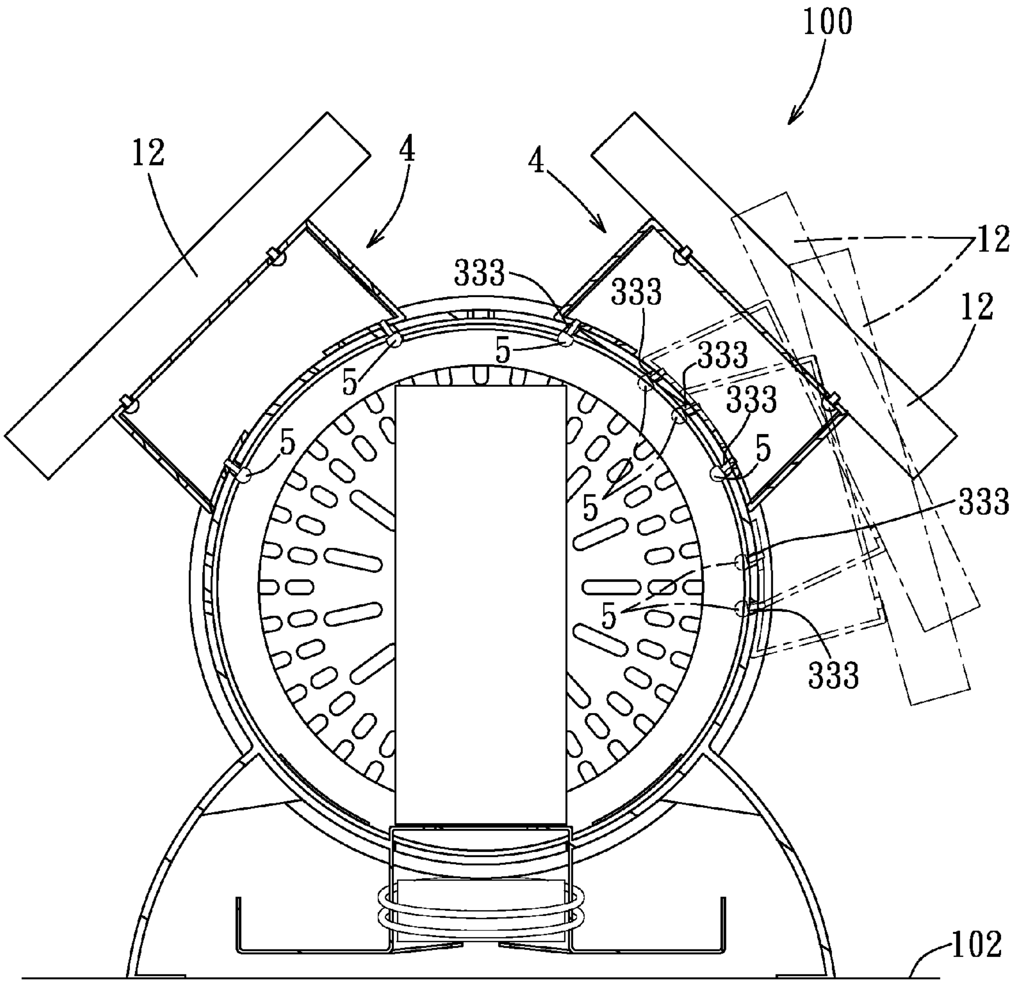
FIG. 6 is a view similar to FIG. 2, but illustrating how the position of the mount can be altered.

With reference to FIG. 6, in this embodiment, the positioning holes 333 in each sidewall 33 are configured as spaced-apart through holes that are aligned in two axially spaced-apart rows along a direction from a high level to a low level. When the locking elements 5 fasten one of the mounts 4 to a selected group of the positioning holes 333, one of the displays 12 can be disposed at an inclination angle of, for example, 45°, 25°, or 15°. By providing more positioning holes in the bracket body 31, each display may be disposed at more different inclination angles.

Figure 7:
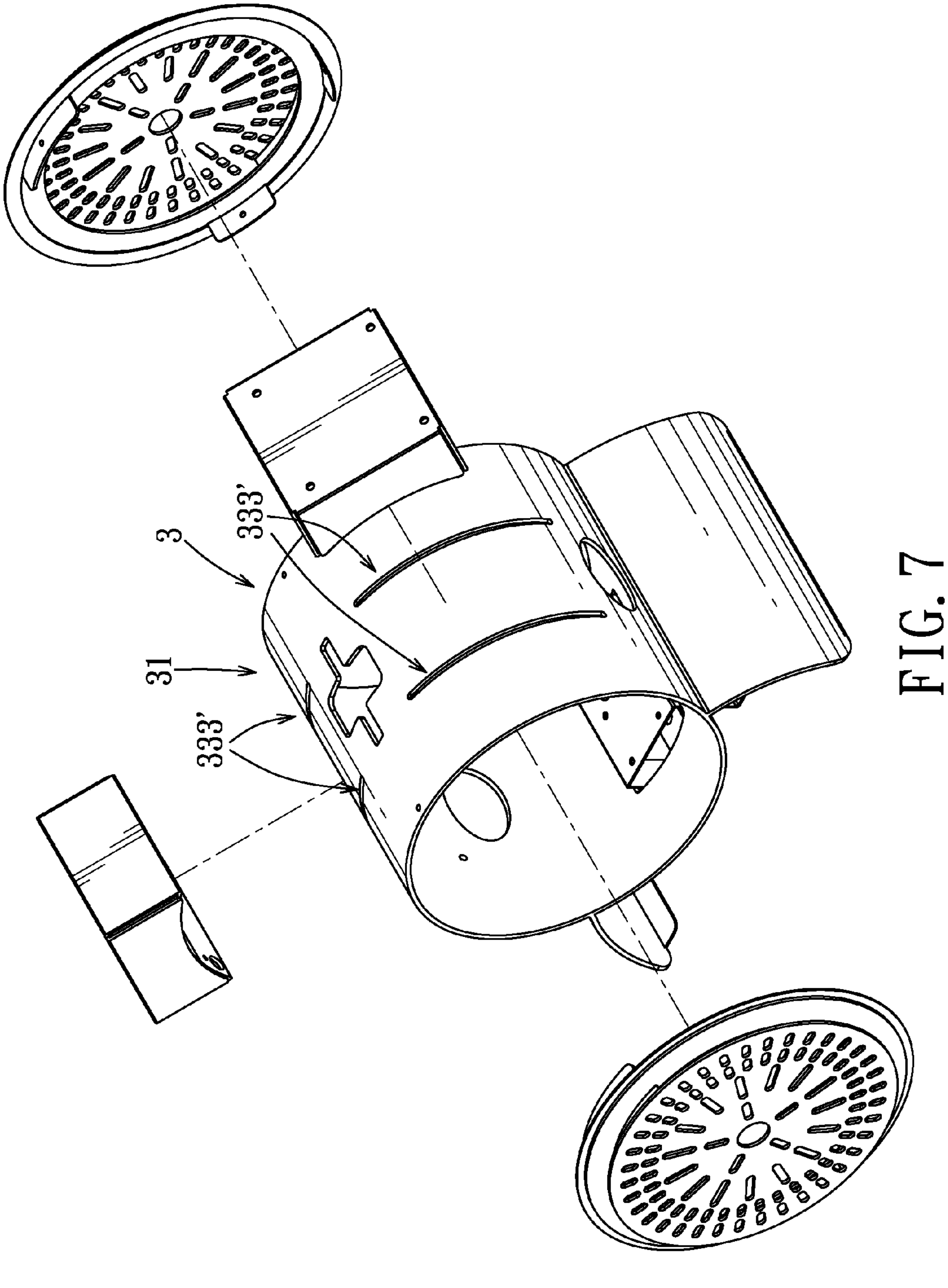
FIG. 7 is an exploded perspective view of an alternative form of the POS system bracket of the embodiment.

In an alternative embodiment, as shown in FIG. 7, the positioning holes 333' in each sidewall 33 may be configured as two axially spaced-apart elongate holes that are elongated along a circumferential direction from a high level to a low level. Compared to the aforesaid positioning holes 333, the locking elements 5 (see FIG. 1) can slide freely along the respective elongate holes or positioning holes 333', thereby easily adjusting the displays 12 (see FIG. 2) to different inclination angles.

It is worth mentioning that the bracket body 31 is not limited to have a tubular wall, as long as the sidewalls 33 thereof have different slopes at different heights (for example, an arcuate surface or a polygonal surface), so that when the locking elements 5 fasten the mounts 4 and the displays 12 to the selected group of the positioning holes, the displays 12 may be disposed at different inclination angles. The beneficial advantage of having the tubular wall is that when the computer main module 11 is disposed in the accommodation space 311, there are lots of free space between the computer main module 11 and the sidewalls 33 for accommodating related accessories and wires.

In summary, through the structural design of the sidewalls 33 of the bracket body 31 and in cooperation with the mounts 4 and the locking elements 5, the displays 12 can be adjusted to different inclination angles using a simple structure. Further, the system 100 can be easily disassembled to facilitate its transport. Moreover, since the computer main module 11 and the displays 12 can be easily disassembled and assembled, the entire POS system 100 has a better expandability as compared to the conventional POS system. Therefore, the objects of this invention can be achieved.

While the present invention has been described in connection with what is considered the most practical and embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A Point-Of-Sale (POS) system bracket for installation of a computer main module and two displays, said POS system bracket comprising:

a bracket housing including a bracket body formed with an accommodation space for receiving the computer main module, and including two opposite sidewalls having inner surfaces facing said accommodation space, outer surfaces each having a substantially convex shape, and a plurality of positioning holes formed at different heights in said sidewalls, and a bottom support connected to said bracket body to support said bracket body on a surface;

two mounts for respectively mounting the displays on said sidewalls, each of said mounts having an outer side adapted to be fixed to one of the displays, and an inner side to be attached to said outer surface of one of said sidewalls; and a plurality of locking elements extending respectively through a selected group of said positioning holes from said inner surfaces of said sidewalls to fasten said mounts to said sidewalls, respectively;

wherein said locking elements can be changed in position from one group of said positioning holes to the other group of said positioning holes, so that said mounts can be positioned at different heights on the respective said sidewalls, and the displays can be disposed at different inclination angles.

2. The POS system bracket as claimed in claim 1, wherein said bracket housing further includes a transformer-receiving portion disposed below said bracket body, and a transformer received in said transformer-receiving portion.

3. The POS system bracket as claimed in claim 2, wherein said bracket housing further includes a wire-handling structure disposed below said bracket body for winding of a wire.

4. The POS system bracket as claimed in claim 3, wherein said wire-handling structure includes a plurality of wire-handling plates, each of said wire-handling plates having a first side plate connected to and extending downward from said bracket body, and a second side plate connected to and extending transversely of said first side plate, said first side plates of said wire-handling plates being spaced apart from each other, said second side plates of said wire-handling plates extending in directions away from each other, said first side plates being adapted to be wound by the wire, said second side plates being adapted to be disposed below the wound wire.

5. The POS system bracket as claimed in claim 4, wherein said bracket housing further includes two lug plates extending respectively and transversely from said first side plates toward each other and opposite to said second side plates, said first side plates and said lug plates cooperatively defining said transformer-receiving portion, said transformer being supported by said lug plates.

6. The POS system bracket as claimed in claim 5, wherein said bottom support includes two spaced-apart support plates connected to and extending downward from said bracket body, said wire-handling structure and said transformer-receiving portion being disposed between said support plates.

7. The POS system bracket as claimed in claim 4, wherein said bracket housing further includes a flat holding plate connected to said first side plates and disposed in said accommodation space, said flat holding plate being adapted to hold and support the computer main module.

8. POS system bracket as claimed in claim 1, wherein said inner side of each of said mounts has a concave shape that complements said outer surface of the respective one of said sidewalls.

9. The POS system bracket as claimed in claim 8, wherein each of said mounts is hollow, and includes an outer wall, two opposite first lateral walls and two opposite second lateral walls connected to said outer wall, and two spaced-apart inner walls respectively extending from said second lateral walls toward each other, said outer wall defining said outer side of a respective one of said mounts, each of said first lateral walls having a concave bottom edge complementing said outer surface of a corresponding one of said sidewalls, said inner walls being substantially flush with said bottom edges of said first lateral walls and defining said inner side of the corresponding one of said mounts.

10. The POS system bracket as claimed in claim 1, wherein said bracket body has a tubular wall that extends around a horizontal axis, and said sidewalls are two portions of said tubular wall on two opposite sides of said horizontal axis.

11. The POS system bracket as claimed in claim 1, wherein said bracket body further includes a top wall connected to said sidewalls, said top wall being provided with a slot for extension of a wire therethrough.

12. The POS system bracket as claimed in claim 10, wherein said bracket body has two axially opposite open ends communicating with said accommodation space, said POS system bracket further comprising two end caps connected removably to and covering said open ends of said bracket body, respectively.

13. The POS system bracket as claimed in claim 12, wherein each of said end caps is formed with a plurality of heat-dissipating holes.

14. The POS system bracket as claimed in claim 10, wherein said positioning holes in each of said sidewalls are configured as spaced-apart through holes that are aligned along a direction from a high level to a low level.

15. The POS system bracket as claimed in claim 10, wherein said positioning holes are configured as elongate holes that are elongated along a direction from a high level to a low level.

16. A Point-Of-Sale (POS) system comprising:

a computer main module;

two displays; and a POS system bracket having a bracket housing including a bracket body formed with an accommodation space to receive the computer main module, and including two opposite sidewalls having inner surfaces facing said accommodation space, outer surfaces each having a substantially convex shape, and a plurality of positioning holes formed at different heights in said sidewalls, and a bottom support connected to said bracket body to support said bracket body on a surface;

two mounts to respectively mount said displays on said sidewalls, each of said mounts having an outer side to be fixed to one of said displays, and an inner side to be attached to said outer surface of one of said sidewalls; and a plurality of locking elements extending respectively through a selected group of said positioning holes from said inner surfaces of said sidewalls to fasten said mounts to said sidewalls, respectively;

wherein said locking elements can be changed in position from one group of said positioning holes to the other group of said positioning holes, so that said mounts can be positioned at different heights on the respective said sidewalls, and said displays can be disposed at different inclination angles.

17. The POS system as claimed in claim 16, wherein said bracket housing further includes a transformer-receiving portion disposed below said bracket body, and a transformer received in said transformer-receiving portion.

18. The POS system as claimed in claim 17, wherein said bracket housing further includes a wire-handling structure disposed below said bracket body for winding of a wire.

19. The POS system as claimed in claim 18, wherein said wire-handling structure includes a plurality of wire-handling plates, each of said wire-handling plates having a first side plate connected to and extending downward from said bracket body, and a second side plate connected to and extending transversely of said first side plate, said first side plates of said wire-handling plates being spaced apart from each other, said second side plates of said wire-handling plates extending in directions away from each other, said first side plates being adapted to be wound by the wire, said second side plates being adapted to be disposed below the wound wire.

20. The POS system as claimed in claim 19, wherein said bracket housing further includes two lug plates extending respectively and transversely from said first side plates toward each other and opposite to said second side plates, said first side plates and said lug plates cooperatively defining said transformer-receiving portion, said transformer being supported by said lug plates.

21. The POS system as claimed in claim 20, wherein said bottom support includes two spaced-apart support plates connected to and extending downward from said bracket body, said wire-handling structure and said transformer-receiving portion being disposed between said support plates.

22. The POS system as claimed in claim 19, wherein said bracket housing further includes a flat holding plate connected to said first side plates and disposed in said accommodation space, said flat holding plate holding and supporting said computer main module.

23. The POS system as claimed in claim 16, wherein said inner side of each of said mounts has a concave shape that complements said outer surface of the respective one of said sidewalls.

24. The POS system as claimed in claim 23, wherein each of said mounts is hollow, and includes an outer wall, two opposite first lateral walls and two opposite second lateral walls connected to said outer wall, and two spaced-apart inner walls extending respectively from said second lateral walls toward each other, said outer wall defining said outer side of a respective one of said mounts, each of said first lateral walls having a concave bottom edge complementing said outer surface of a corresponding one of said sidewalls, said inner walls being substantially flush with said bottom edges of said first lateral walls and defining said inner side of the corresponding one of said mounts.

25. The POS system as claimed in claim 16, wherein said bracket body has a tubular wall extending around a horizontal axis, and said sidewalls are two portions of said tubular wall on two opposite sides of said horizontal axis.

26. The POS system as claimed in claim 16, wherein said bracket body further includes a top wall connected to said sidewalls, said top wall being provided with a slot for extension of a wire therethrough.

27. The POS system as claimed in claim 25, wherein said bracket body has two axially opposite open ends communicating with said accommodation space, said POS system bracket further including two end caps connected removably to and covering said open ends of said bracket body, respectively.

28. The POS system as claimed in claim 27, wherein each of said end caps is formed with a plurality of heat-dissipating holes.

29. The POS system as claimed in claim 25, wherein said positioning holes in each of said sidewalls are configured as spaced-apart through holes that are aligned along a direction from a high level to a low level.

30. The POS system as claimed in claim 25, wherein said positioning holes are configured as elongate holes that are elongated along a direction from a high level to a low level.

* * * * *